United States Patent
Ito

(10) Patent No.: US 8,125,103 B2
(45) Date of Patent: Feb. 28, 2012

(54) SEMICONDUCTOR DEVICE SYSTEM IN PACKAGE

(75) Inventor: Shuichi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 367 days.

(21) Appl. No.: 12/364,569

(22) Filed: Feb. 3, 2009

(65) Prior Publication Data

US 2009/0224601 A1 Sep. 10, 2009

(30) Foreign Application Priority Data

Mar. 5, 2008 (JP) ................. 2008-054380

(51) Int. Cl.
*H02J 1/00* (2006.01)
*H01H 33/59* (2006.01)
*H03L 5/00* (2006.01)
*G01R 31/26* (2006.01)

(52) U.S. Cl. ...... 307/72; 307/115; 327/333; 324/762.06
(58) Field of Classification Search .................... 307/72, 307/115; 327/333; 324/762.06
See application file for complete search history.

(56) References Cited

U.S. PATENT DOCUMENTS

| 5,315,167 A * | 5/1994 | Chan et al. .................... 327/537 |
| 6,603,331 B1 * | 8/2003 | Om'Mani et al. ............... 326/38 |
| 7,688,090 B2 * | 3/2010 | Khandros et al. ........ 324/750.05 |
| 2008/0054724 A1 * | 3/2008 | Hosomi et al. .................. 307/69 |
| 2009/0009004 A1 * | 1/2009 | Fujiwara ......................... 307/80 |

FOREIGN PATENT DOCUMENTS

| JP | 2004-053276 | 2/2004 |
| JP | 2008-004639 | * 1/2008 |

OTHER PUBLICATIONS

Japanese Office Action for 2008-054380 mailed on Aug. 11, 2010.

* cited by examiner

*Primary Examiner* — Michael Rutland Wallis
(74) *Attorney, Agent, or Firm* — Turocy & Watson, LLP

(57) ABSTRACT

A semiconductor device includes, in one package: a plurality of semiconductor chips having different operating voltages; and a power supply circuit configured to receive an input voltage from an external power supply and supply operating voltages to the semiconductor chips. The power supply circuit is capable of switching and supplying a plurality of different voltages for each one of the semiconductor chips.

18 Claims, 9 Drawing Sheets

SEMICONDUCTOR DEVICE SYSTEM IN PACKAGE

CROSS-REFERENCE TO RELATED APPLICATIONS

This application is based upon and claims the benefit of priority from the prior Japanese Patent Application No. 2008-054380, filed on Mar. 5, 2008; the entire contents of which are incorporated herein by reference.

BACKGROUND OF THE INVENTION

1. Field of the Invention

This invention relates to a semiconductor device, and more particularly to a semiconductor device having a structure in which a plurality of semiconductor chips are housed with a power supply circuit in one package.

2. Background Art

There is known a semiconductor device, such as those called SiP (system in package) and MCL (multi-chip LSI), which houses a plurality of semiconductor chips having different operating voltages, because of variations in manufacturing processes and specifications, in one package to function as a system.

In general, a semiconductor device undergoes a burn-in test in which the device is operated for a prescribed time under a higher power supply voltage (stress voltage) than in the normal operating condition for the purpose of rapidly detecting any initial failures in the chips to remove initial defective products.

For example, JP-A-2004-053276 (Kokai) discloses a semiconductor device which houses a logic chip and a memory chip in one package and functions as a system. The package substrate thereof has a first power supply terminal VDD1 and a first ground terminal GND1 connected respectively to the power supply terminal and ground terminal of the logic chip, and a second power supply terminal VDD2 and a second ground terminal GND2 connected respectively to the power supply terminal and ground terminal of the memory chip. During burn-in test, a prescribed voltage is externally supplied through the above terminals VDD1, GND1, VDD2, GND2 connected to the chips.

In SiP and the like, there is a strong demand for operation with one power supply. To meet this demand, it may be contemplated to mount a power supply circuit in conjunction with load chips on the same substrate (interposer), in which the power supply circuit converts (step-down or step-up) an input voltage received from an external power supply and supplies an operating voltage predetermined for each chip. However, in this case, during burn-in test, the supply voltage to each chip is left unchanged even if the external power supply voltage is changed, and an appropriate stress voltage cannot be applied to each chip.

SUMMARY OF THE INVENTION

According to an aspect of the invention, there is provided a semiconductor device including, in one package: a plurality of semiconductor chips having different operating voltages; and a power supply circuit configured to receive an input voltage from an external power supply and supply operating voltages to the semiconductor chips, the power supply circuit being capable of switching and supplying a plurality of different voltages for each one of the semiconductor chips.

DETAILED DESCRIPTION OF THE INVENTION

The semiconductor device according to the embodiments of the invention houses, in one package, a plurality of semiconductor chips having different operating voltages and a power supply circuit for receiving an input voltage from an external power supply and supplying operating voltages to the semiconductor chips.

In this configuration, during burn-in test, the output of the power supply circuit is decoupled from each chip, and a stress voltage is externally supplied to each chip. Thus, an appropriate stress voltage can be applied to each chip. However, in this case, a plurality of external power supplies for burn-in need to be prepared in accordance with the number of chips. Furthermore, the need of many external power supplies for burn-in translates into the need of many external terminals on the package substrate by which the chips are connected to the external power supplies. Moreover, the package substrate also needs interconnects between the external terminals and the chips. Thus, the design of the semiconductor device is complicated, the burn-in device is upsized, and the cost is increased.

Thus, in the embodiments of the invention, as described below with reference to the drawings, the power supply circuit incorporated in the package is also provided with a burn-in mode besides the normal operation mode.

First Embodiment

Figure 1:
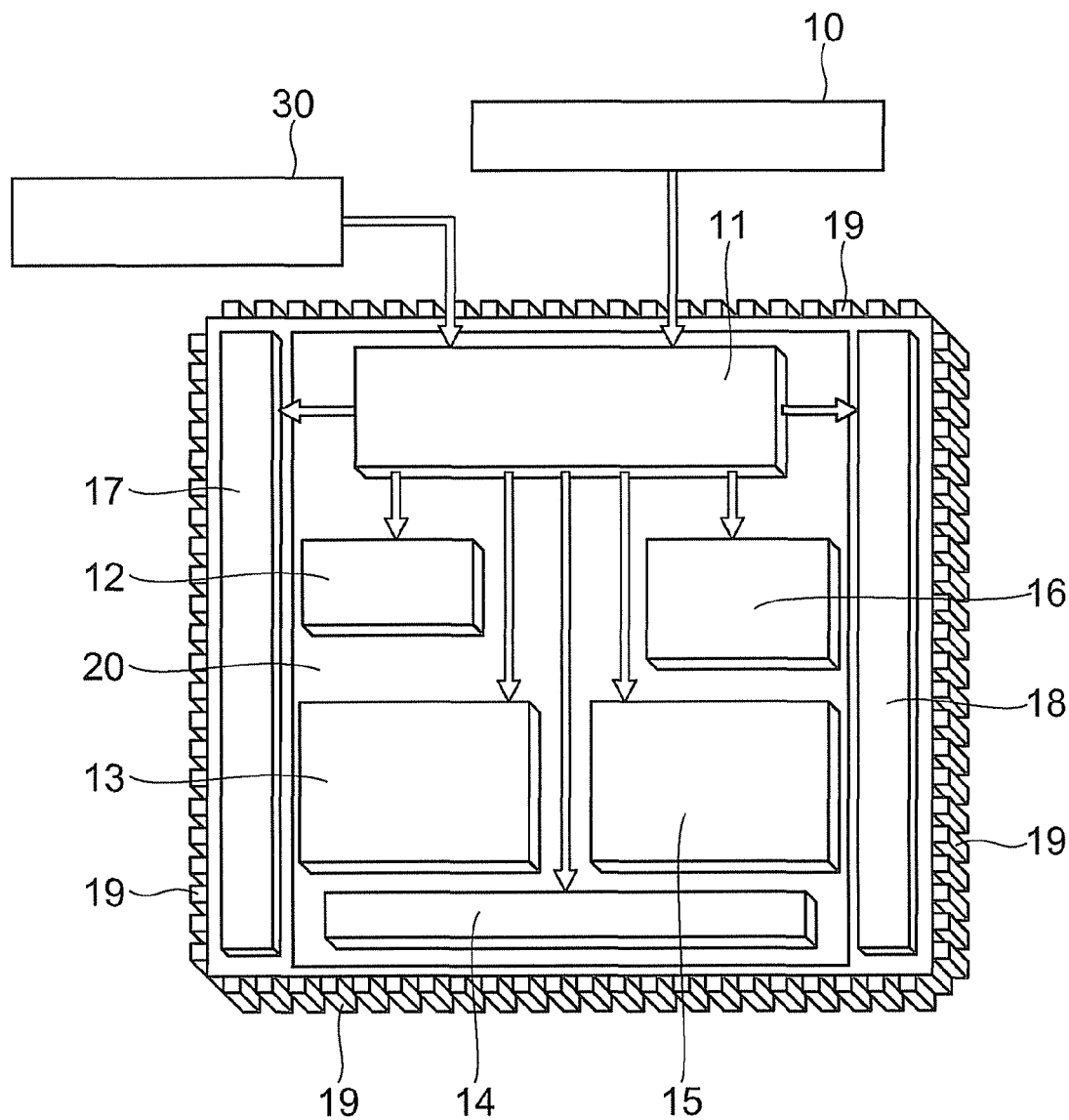
FIG. 1 is a schematic view showing the configuration of a semiconductor device according to a first embodiment of the invention.

FIG. 1 is a schematic view showing the configuration of a semiconductor device according to a first embodiment of the invention.

The semiconductor device according to this embodiment has a structure called SiP (system in package) or MCL (multi-chip LSI) in which a plurality of semiconductor chips are housed in one package. FIG. 1 shows a side-by-side structure in which a plurality of semiconductor chips are horizontally juxtaposed without stacking. However, it is also possible to use a stacked structure in which a plurality of semiconductor chips are stacked, or a combination of the side-by-side and stacked structure.

The plurality of semiconductor chips (hereinafter simply referred to as chips) 12-18 are mounted on a substrate (interposer) 20. Furthermore, in this embodiment, a power supply circuit 11 for supplying voltage to each chip 12-18 is also mounted on the same substrate 20.

These chips 12-18 and the power supply circuit 11 are connected by interconnects formed on the substrate 20 or bonding wires, bumps, and the like, and function as one integrated system.

The chips 12-18 and the power supply chip 11 are connectable to external circuits illustratively through external terminals 19 extracted around the periphery of the substrate 20. The portion other than the external terminals 19 is illustratively packaged with resin for protection.

The chips 12-18 have different operating voltages because of, for example, variations in manufacturing processes and specifications. For example, the chip 12 is an analog chip, the chip 13 is a logic chip, the chip 14 is an HSIO (high speed input output) interface, the chip 15 is a DRAM (dynamic random access memory), the chip 16 is an SRAM (static random access memory), and the chips 17, 18 are I/O chips.

In response to an input voltage received from an external power supply 10, which is mounted illustratively on a PCB (printed circuit board) in conjunction with the semiconductor device according to this embodiment, the power supply circuit 11 converts the input voltage and supplies an optimal operating voltage for each chip 12-18.

In this embodiment, the power supply circuit 11 has not only a normal operation mode for supplying an operating voltage to each chip 12-18, but also a burn-in (test) mode for supplying a higher voltage (stress voltage) than during normal operation.

That is, the power supply circuit 11 can selectively switch and supply a plurality of different voltages (the operating voltage during normal operation and the stress voltage during the burn-in mode) for each one of the semiconductor chips.

Figure 2:
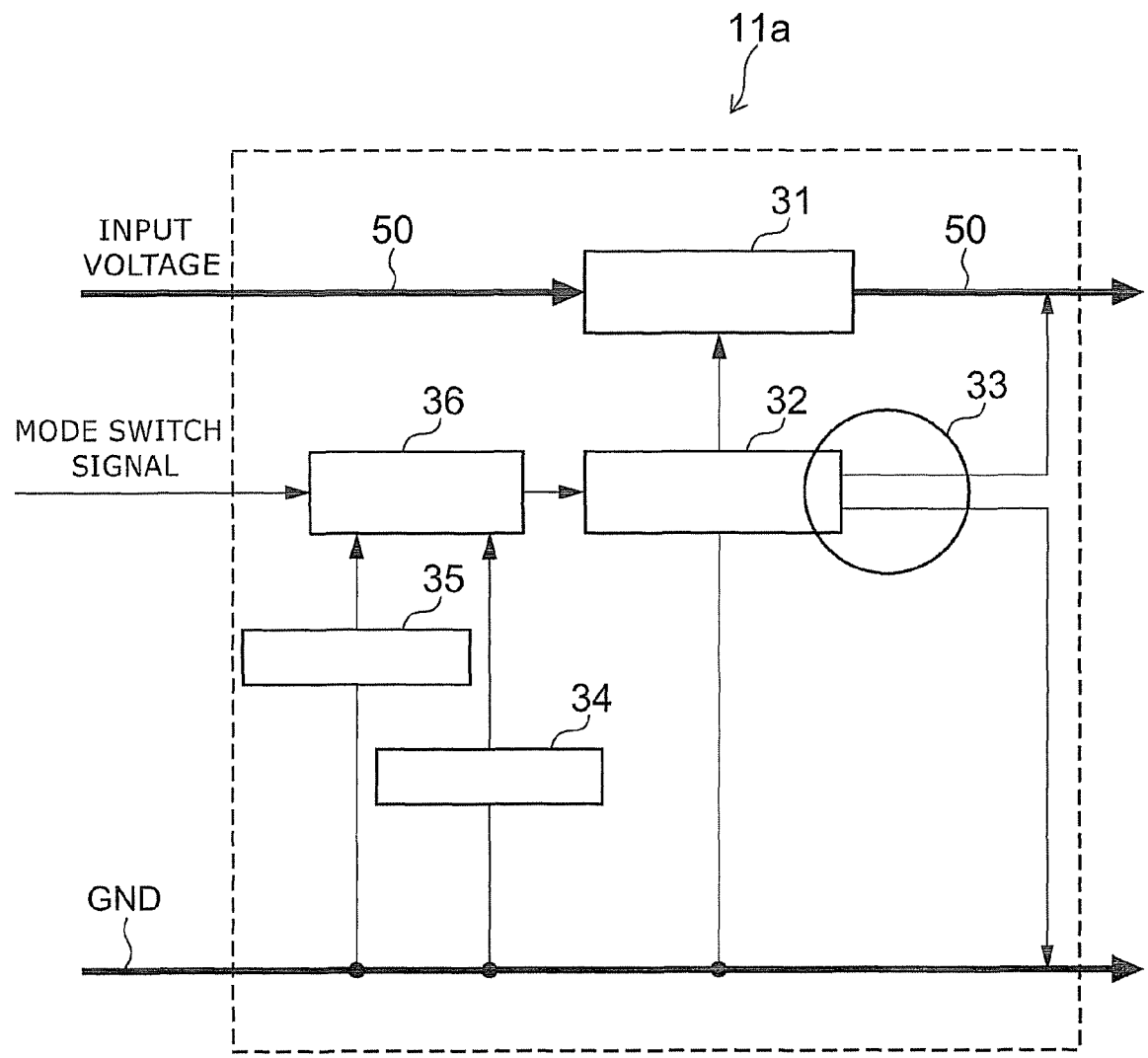
FIG. 2 is a schematic view showing the configuration of the power supply circuit of the first embodiment.

FIG. 2 shows a specific example of the configuration of the power supply circuit. The power supply circuit 11a in FIG. 2 corresponds to the power supply circuit 11 in FIG. 1.

The power supply circuit 11a includes a power supply line 50 connected to the external power supply 10 through external terminals 19 shown in FIG. 1, and a ground line GND. A power circuit 31, a voltage control circuit 32, a voltage measurement section 33, a first reference voltage generation circuit 34, a second reference voltage generation circuit 35, and a switch circuit 36 are connected between the power supply line 50 and the ground line GND. The power supply circuit 11a includes as many sets of these circuits shown in FIG. 2 as load chips mounted on the same substrate 20.

The first reference voltage generation circuit 34 generates, as a first reference voltage, an operating voltage during the normal operation of the associated chip. The second reference voltage generation circuit 35 generates, as a second reference voltage, a stress voltage during the burn-in (test) of the associated chip.

In response to an input voltage from the external power supply 10, under the control of the voltage control circuit 32, the power circuit 31 converts (step-down or step-up) the input voltage and outputs the result to each chip 12-18. The voltage measurement section 33 measures the output voltage of this power supply circuit 11a. The voltage control circuit 32 controls the power circuit 31 so that the voltage measured by the voltage measurement section 33 is equal to the first reference voltage or the second reference voltage.

In response to a mode switch signal from an external burn-in (test) mode setting device 30 (see FIG. 1), the power supply circuit 11a is switched whether to supply each chip 12-18 with an operating voltage for normal operation time (corresponding to the first reference voltage) or a stress voltage for burn-in (test) time (corresponding to the second reference voltage). That is, the switch circuit 36 shown in FIG. 2 switches the reference voltage (the first reference voltage or the second reference voltage) outputted to the voltage control circuit 32 on the basis of the mode switch signal, and accordingly the output voltage of the power supply circuit 11a is switched.

Besides the external terminals needed for external input/output during normal operation, an external terminal for mode switch setting is separately provided so that the external burn-in (test) mode setting device 30 can perform mode switch setting (send a mode switch signal) through the external terminal for mode switch setting.

In the normal operation mode, the power supply circuit 11a supplies each chip 12-18 with an associated operating voltage. In the burn-in (test) mode, it supplies each chip 12-18 with an associated stress voltage, which is higher than the operating voltage. Setting of the burn-in voltage for each chip can be performed illustratively by a fuse provided in the power supply circuit 11a.

That is, in this embodiment, chips 12-18 are mounted on the substrate (interposer) 20, and a power supply circuit 11a for supplying an operating voltage to each chip 12-18 is also mounted on the same substrate 20. Furthermore, the power supply circuit 11a has not only a normal operation mode, but also a burn-in (test) mode. In other words, the power supply circuit 11a serving as a voltage supply source during normal operation also serves as a voltage supply source during burn-in (test), and can provide an optimal stress voltage to each mounted chip 12-18 in accordance with its characteristics. Thus, the optimized burn-in (test) serves to improve product quality.

According to the configuration of this embodiment as described above, there is no need to prepare a plurality of external power supplies for burn-in (test) in accordance with the number of chips 12-18, but only one external power supply 10 is needed. Furthermore, no need of many external power supplies for burn-in translates into no need of many external terminals by which the chips 12-18 are connected to the external power supplies. Moreover, the substrate 20 does not also need interconnects between the external terminals and the chips 12-18. Consequently, the design of the semiconductor device is facilitated, the burn-in device is simplified, and the cost is reduced.

In the following, other embodiments of the invention are described. The same components as those in the above first embodiment are labeled with like reference numerals.

Second Embodiment

Figure 3:
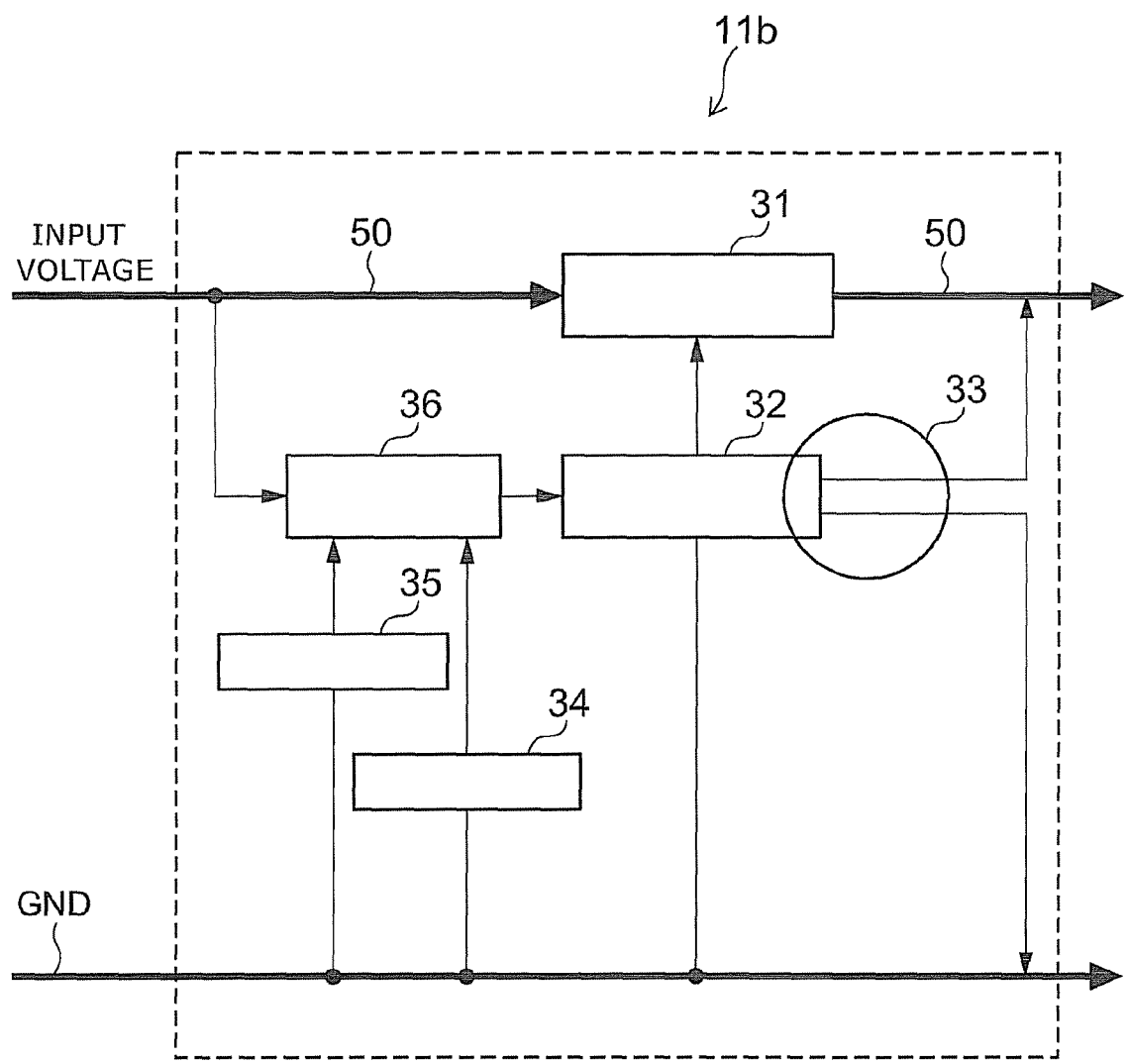
FIG. 3 is a schematic view showing the configuration of a power supply circuit in a semiconductor device according to a second embodiment of the invention.

FIG. 3 shows an example of the configuration of a power supply circuit 11b in a semiconductor device according to a second embodiment. This power supply circuit 11b corresponds to the power supply circuit 11 described above with reference to FIG. 1.

In this embodiment, the voltage supplied to each chip 12-18 is switched on the basis of the input voltage from the external power supply 10. Specifically, the switch circuit 36 monitors the input voltage from the external power supply 10. When the input voltage reaches a certain value or more, the reference voltage outputted to the voltage control circuit 32 is switched from the first reference voltage corresponding to the operating voltage for normal operation time to the second reference voltage corresponding to the stress voltage for burn-in time.

In this configuration, the substrate 20 does not need a dedicated external terminal for externally receiving a burn-in setting signal and an interconnect between that external terminal and the power supply circuit.

Third Embodiment

Figure 4:
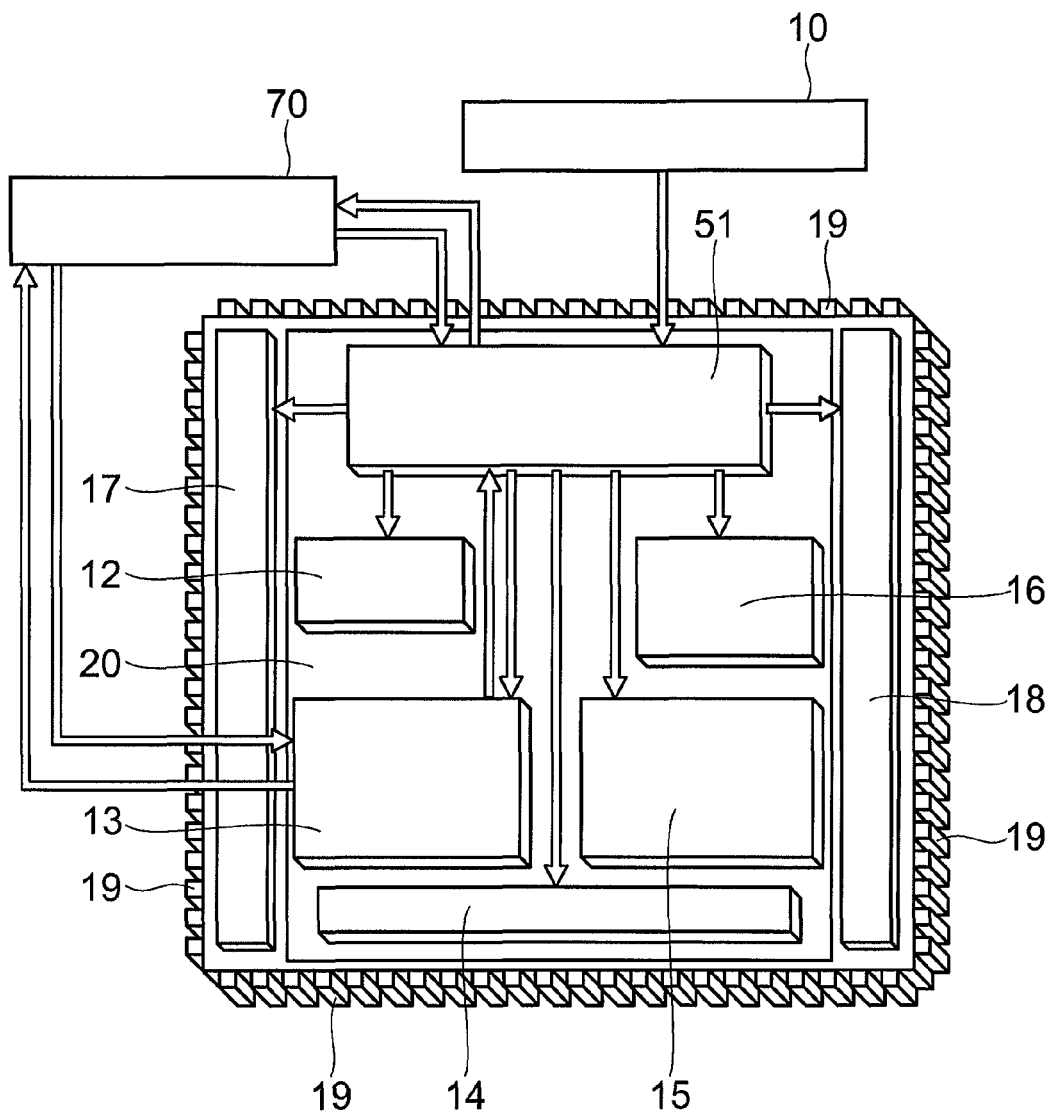
FIG. 4 is a schematic view showing the configuration of a semiconductor device according to a third embodiment of the invention.

FIG. 4 is a schematic view showing the configuration of a semiconductor device according to a third embodiment of the invention.

Also in this embodiment, a plurality of chips 12-18 and a power supply circuit 51 for supplying voltage to these chips 12-18 are mounted on the same substrate 20 and integrated into one package.

The power supply circuit 51 has not only a normal operation mode for supplying an operating voltage to each chip 12-18, but also a burn-in (test) mode for supplying a higher voltage (stress voltage) than during normal operation.

Figure 5:
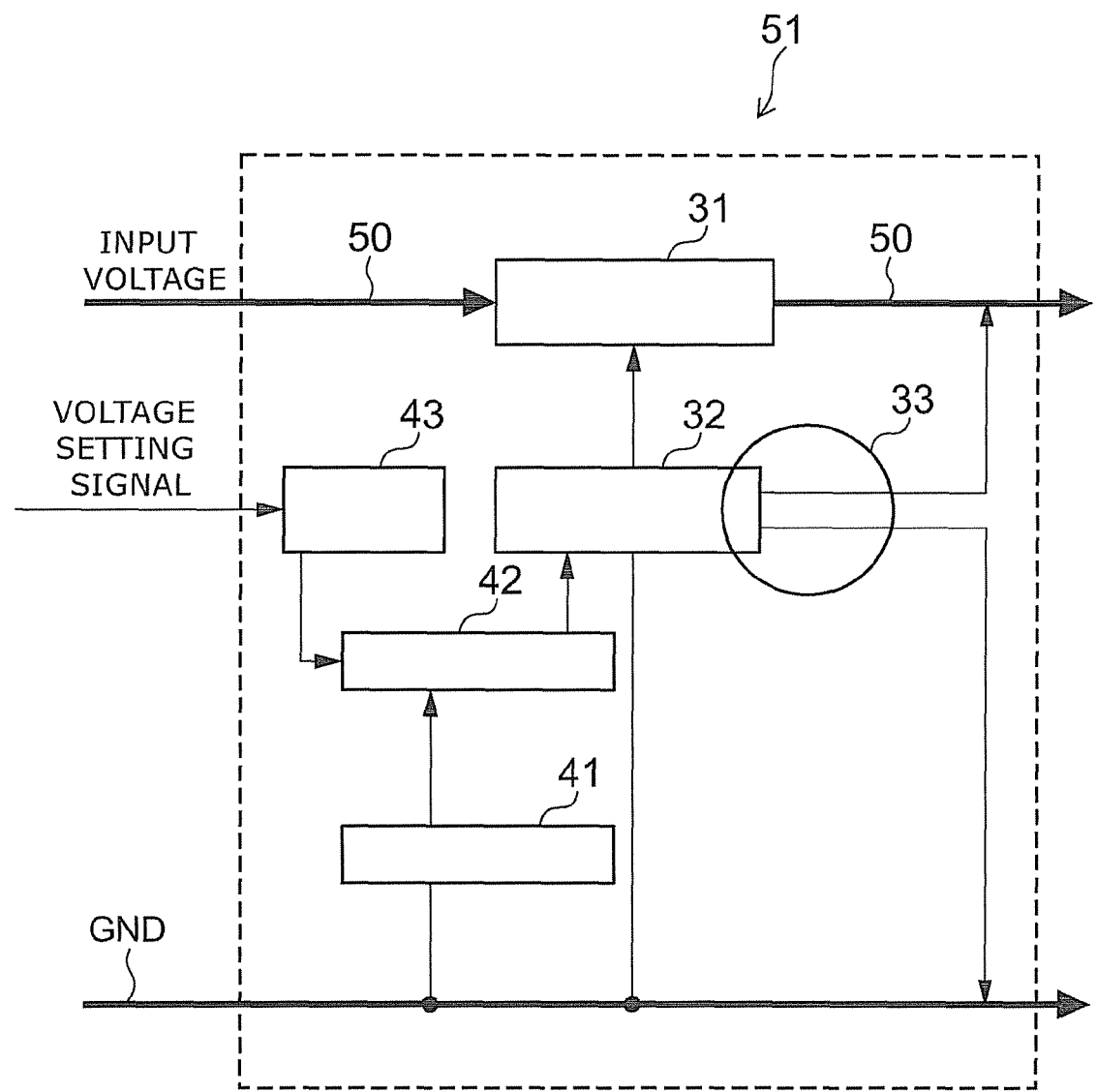
FIG. 5 is a schematic view showing the configuration of the power supply circuit of the third embodiment.

FIG. 5 shows a specific example of the configuration of the power supply circuit 51.

The power supply circuit 51 includes a power supply line 50 connected to the external power supply 10 through external terminals 19 shown in FIG. 4, and a ground line GND. A power circuit 31, a voltage control circuit 32, a voltage measurement section 33, a reference voltage generation circuit 41, a reference voltage variation circuit 42, and a communication circuit 43 are connected between the power supply line 50 and the ground line GND. The power supply circuit 51 includes as many sets of these circuits shown in FIG. 5 as load chips mounted on the same substrate 20.

In this embodiment, the power supply circuit 51 includes a communication circuit 43 for parallel or serial communication with an external burn-in mode setting device 70. In response to a voltage setting signal from the burn-in mode setting device 70, the power supply circuit 51 sets a voltage supplied to each chip 12-18.

During normal operation, the voltage control circuit 32 controls the power circuit 31 so that the voltage measured by the voltage measurement section 33 is equal to a reference voltage (corresponding to the operating voltage defined for each chip) generated by the reference voltage generation circuit 41. Under the control of the voltage control circuit 32, the power circuit 31 converts (step-down or step-up) the input voltage from the external power supply 10 and outputs the result to each chip 12-18.

During the burn-in mode, when the burn-in mode setting device 70 sends a burn-in mode setting signal to the power supply circuit 51, the power supply circuit 51 returns a voltage setting request signal to the burn-in mode setting device 70. In response, the burn-in mode setting device 70 sends a burn-in voltage (stress voltage) setting signal for each chip 12-18 to the power supply circuit 51. The communication circuit 43 receives the voltage setting signal and outputs it to the reference voltage variation circuit 42.

On the basis of the voltage setting signal, the reference voltage variation circuit 42 varies the reference voltage generated by the reference voltage generation circuit 41 and outputs the result to the voltage control circuit 32.

The voltage control circuit 32 controls the power circuit 31 so that the voltage measured by the voltage measurement section 33 is equal to the voltage outputted from the reference voltage variation circuit 42. Under the control of the voltage control circuit 32, the power circuit 31 converts (step-down or step-up) the input voltage from the external power supply 10 and outputs the result to each chip 12-18.

That is, also in this embodiment, the power supply circuit 51 serving as a voltage supply source during normal operation also serves as a voltage supply source during burn-in (test), and can provide an optimal stress voltage to each mounted chip 12-18 in accordance with its characteristics. Thus, the optimized burn-in (test) serves to improve product quality.

Furthermore, also in this embodiment, there is no need to prepare a plurality of external power supplies for burn-in (test) in accordance with the number of chips 12-18, but only one external power supply 10 is needed. Furthermore, there is also no need of many external terminals for burn-in. Moreover, the substrate 20 does not also need interconnects between the external terminals and the chips 12-18. Consequently, the design of the semiconductor device is facilitated, the burn-in device is simplified, and the cost is reduced.

As an alternative configuration, the power supply circuit 51 may exchange the above signals such as the burn-in mode setting and voltage setting signal with the burn-in mode setting device 70 through, for example, the chip 13 serving as a logic chip. The logic chip 13 can exchange signals with the burn-in mode setting device 70 during burn-in test through an external terminal that is originally intended for external input/output of signals during normal operation. Hence, the power supply circuit 51 does not need to separately include a dedicated external terminal for exchanging signals with the burn-in mode setting device 70 during burn-in test.

Fourth Embodiment

Figure 6:
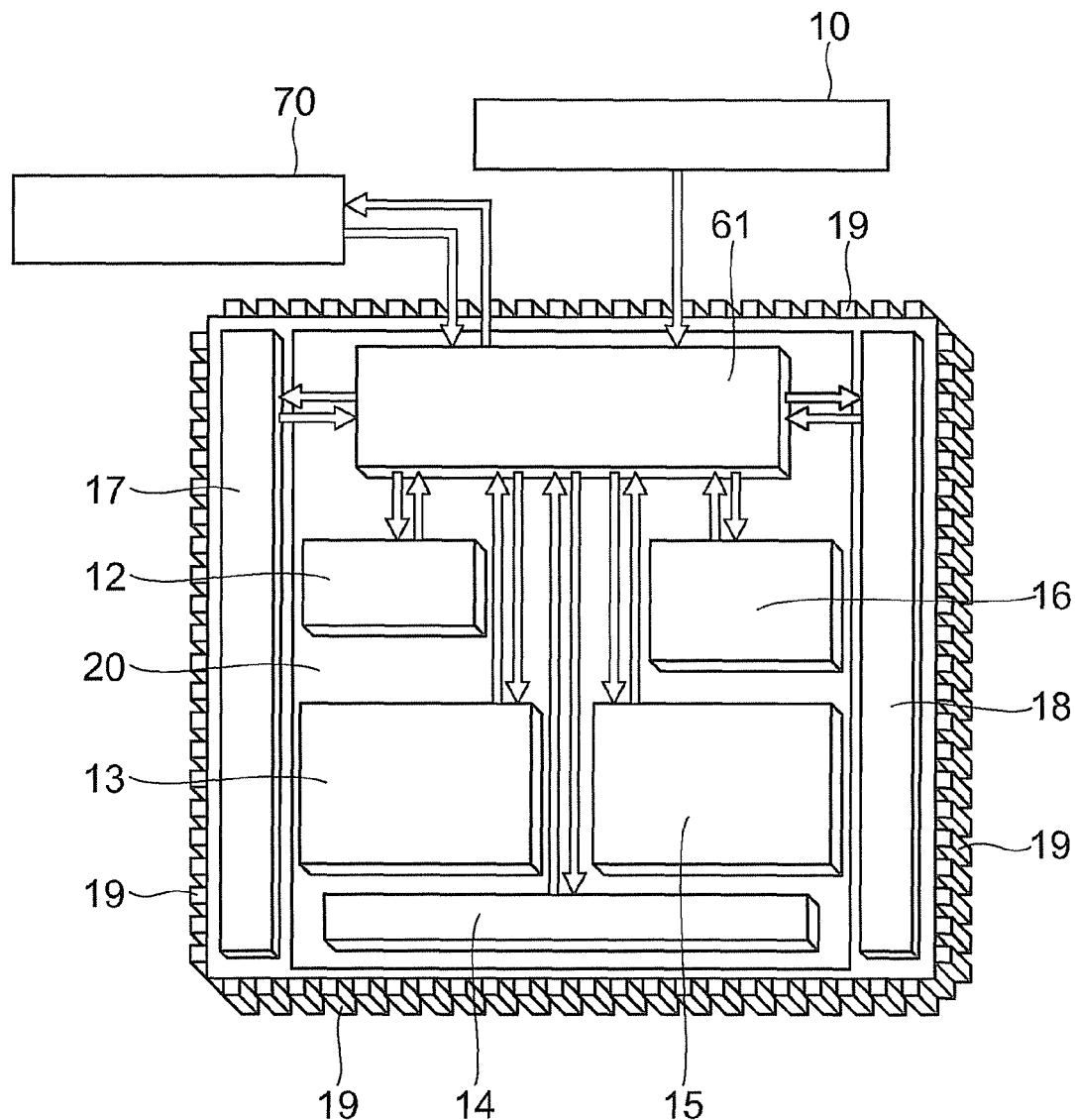
FIG. 6 is a schematic view showing the configuration of a semiconductor device according to a fourth embodiment of the invention.

FIG. 6 is a schematic view showing the configuration of a semiconductor device according to a fourth embodiment of the invention.

Also in this embodiment, a plurality of chips 12-18 and a power supply circuit 61 for supplying voltage to these chips 12-18 are mounted on the same substrate 20 and integrated into one package.

The power supply circuit 61 has not only a normal operation mode for supplying an operating voltage to each chip 12-18, but also a burn-in (test) mode for supplying a higher voltage (stress voltage) than during normal operation. Furthermore, the power supply circuit 61 also has a function of detecting the operating state of each chip 12-18, and optimizes the voltage supplied to each chip 12-18 on the basis of the detection result.

Figure 7:
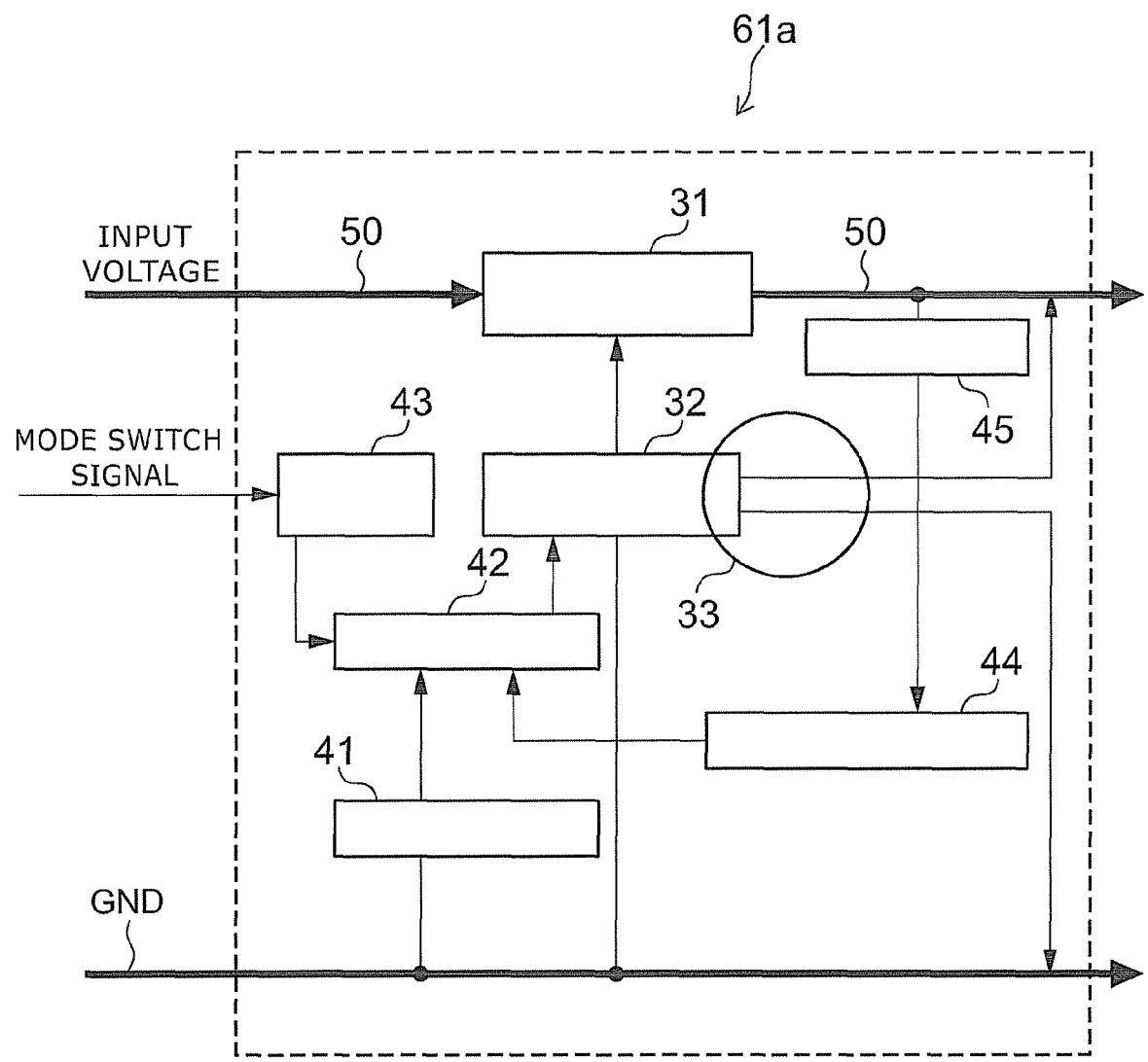
FIG. 7 is a schematic view showing the configuration of the power supply circuit of the fourth embodiment.

FIG. 7 shows a specific example of the configuration of the power supply circuit. The power supply circuit 61a in FIG. 7 corresponds to the power supply circuit 61 in FIG. 6.

The power supply circuit 61a includes a power supply line 50 connected to the external power supply 10 through external terminals 19 shown in FIG. 6, and a ground line GND. A power circuit 31, a voltage control circuit 32, a voltage measurement section 33, a current measurement circuit 45, an optimal voltage setting circuit 44, a reference voltage generation circuit 41, a reference voltage variation circuit 42, and a communication circuit 43 are connected between the power supply line 50 and the ground line GND. The power supply circuit 61a includes as many sets of these circuits shown in FIG. 7 as load chips mounted on the same substrate 20.

Also in this embodiment, like the above third embodiment, during the burn-in mode, when the burn-in mode setting device 70 sends a burn-in mode setting signal to the power supply circuit 61a, the power supply circuit 61a returns a voltage setting request signal to the burn-in mode setting device 70. In response, the burn-in mode setting device 70 sends a burn-in voltage (stress voltage) setting signal for each chip 12-18 to the power supply circuit 61a. The communication circuit 43 receives the voltage setting signal and outputs it to the reference voltage variation circuit 42. On the basis of the voltage setting signal, the reference voltage variation circuit 42 varies the reference voltage generated by the reference voltage generation circuit 41 and outputs the result to the voltage control circuit 32.

The voltage control circuit 32 controls the power circuit 31 so that the voltage measured by the voltage measurement section 33 is equal to the voltage outputted from the reference voltage variation circuit 42. Under the control of the voltage control circuit 32, the power circuit 31 converts (step-down or step-up) the input voltage from the external power supply 10 and outputs the result to each chip 12-18.

That is, also in this embodiment, the power supply circuit 61a serving as a voltage supply source during normal operation also serves as a voltage supply source during burn-in (test), and can provide an optimal stress voltage to each mounted chip 12-18 in accordance with its characteristics. Thus, the optimized burn-in (test) serves to improve product quality.

Furthermore, also in this embodiment, there is no need to prepare a plurality of external power supplies for burn-in (test) in accordance with the number of chips 12-18, but only one external power supply 10 is needed. Furthermore, there is also no need of many external terminals for burn-in. Moreover, the substrate 20 does not also need interconnects between the external terminals and the chips 12-18. Consequently, the design of the semiconductor device is facilitated, the burn-in device is simplified, and the cost is reduced.

Furthermore, in this embodiment, the current measurement circuit 45 measures the current consumption of each chip 12-18 from the current outputted from the power circuit 31 to each chip 12-18. In response to this measurement result, the optimal voltage setting circuit 44 calculates the power consumption of each chip 12-18 and sets an optimal voltage so that the temperature does not exceed the maximum junction temperature Tj defined for each chip 12-18, which is obtained from the correlation with this power consumption. In response to this optimal voltage setting signal, the reference voltage variation circuit 42 varies the reference voltage generated by the reference voltage generation circuit 41 and outputs the result to the voltage control circuit 32. Under the control of the voltage control circuit 32, the power circuit 31 converts (step-down or step-up) the input voltage from the external power supply 10 and outputs the result to each chip 12-18.

Thus, in this embodiment, an optimal stress voltage can be set on the basis of the characteristics of each chip 12-18 during actual operation, and a more reliable test can be performed.

Fifth Embodiment

Figure 8:
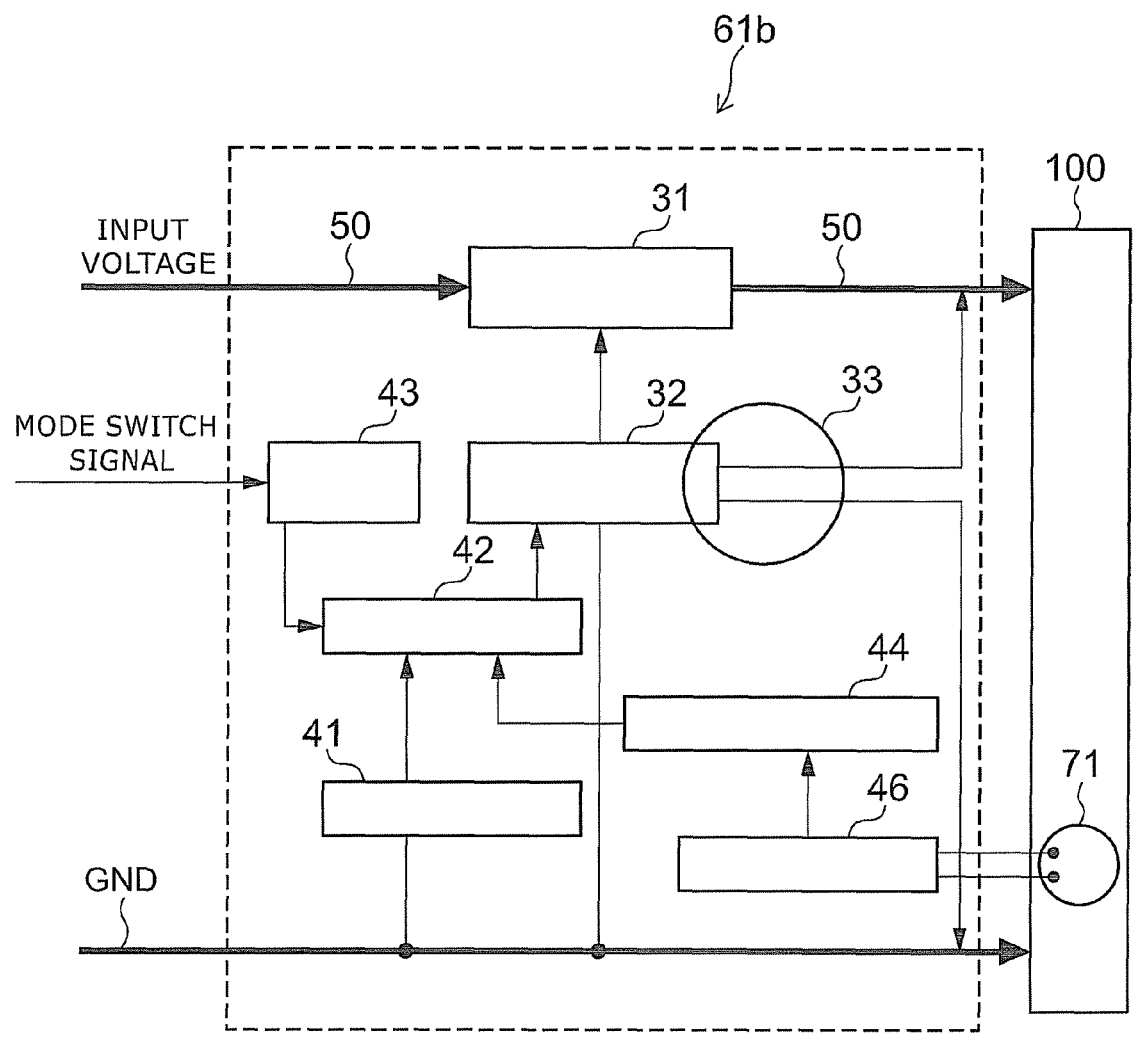
FIG. 8 is a schematic view showing the configuration of a power supply circuit in a semiconductor device according to a fifth embodiment of the invention.

FIG. 8 shows an example of the configuration of a power supply circuit 61b in a semiconductor device according to a fifth embodiment. This power supply circuit 61b corresponds to the power supply circuit 61 described above with reference to FIG. 6.

The power supply circuit 61b includes a power supply line 50 connected to the external power supply 10 through external terminals 19 shown in FIG. 6, and a ground line GND. A power circuit 31, a voltage control circuit 32, a voltage measurement section 33, an optimal voltage setting circuit 44, a temperature monitoring circuit 46, a reference voltage generation circuit 41, a reference voltage variation circuit 42, and a communication circuit 43 are connected between the power supply line 50 and the ground line GND. The power supply circuit 61b includes as many sets of these circuits shown in FIG. 8 as load chips mounted on the same substrate 20.

Also in this embodiment, like the above third and fourth embodiment, during the burn-in mode, when the burn-in mode setting device 70 sends a burn-in mode setting signal to the power supply circuit 61b, the power supply circuit 61b returns a voltage setting request signal to the burn-in mode setting device 70. In response, the burn-in mode setting device 70 sends a burn-in voltage (stress voltage) setting signal for each chip 12-18 to the power supply circuit 61b. The communication circuit 43 receives the voltage setting signal and outputs it to the reference voltage variation circuit 42. On the basis of the voltage setting signal, the reference voltage variation circuit 42 varies the reference voltage generated by the reference voltage generation circuit 41 and outputs the result to the voltage control circuit 32.

The voltage control circuit 32 controls the power circuit 31 so that the voltage measured by the voltage measurement section 33 is equal to the voltage outputted from the reference voltage variation circuit 42. Under the control of the voltage control circuit 32, the power circuit 31 converts (step-down or step-up) the input voltage from the external power supply 10 and outputs the result to each chip 12-18.

That is, also in this embodiment, the power supply circuit 61b serving as a voltage supply source during normal operation also serves as a voltage supply source during burn-in (test), and can provide an optimal stress voltage to each mounted chip 12-18 in accordance with its characteristics. Thus, the optimized burn-in (test) serves to improve product quality.

Furthermore, also in this embodiment, there is no need to prepare a plurality of external power supplies for burn-in (test) in accordance with the number of chips 12-18, but only one external power supply 10 is needed. Furthermore, there is also no need of many external terminals for burn-in. Moreover, the substrate 20 does not also need interconnects between the external terminals and the chips 12-18. Consequently, the design of the semiconductor device is facilitated, the burn-in device is simplified, and the cost is reduced.

Furthermore, in this embodiment, each chip 12-18 (the individual chip is shown as a chip 100 in FIG. 8) includes a temperature probe 71 such as a temperature sensor or thermal diode. Alternatively, a temperature probe 71 may be provided on the substrate 20.

From the temperature obtained through the temperature probe 71, the temperature monitoring circuit 46 calculates the maximum junction temperature Tj defined for each chip 12-18, and the optimal voltage setting circuit 44 sets an optimal voltage so that the temperature does not exceed the temperature Tj. In response to this optimal voltage setting signal, the reference voltage variation circuit 42 varies the reference voltage generated by the reference voltage generation circuit 41 and outputs the result to the voltage control circuit 32. Under the control of the voltage control circuit 32, the power circuit 31 converts (step-down or step-up) the input voltage from the external power supply 10 and outputs the result to each chip 12-18. Thus, also in this embodiment, an optimal stress voltage can be set on the basis of the characteristics of each chip 12-18 during actual operation, and a more reliable test can be performed.

It is noted that in the above fourth and fifth embodiment, the junction temperature Tj for each chip may be calculated (predicted) from other electrical characteristics (e.g., forward voltage Vf) for each chip.

The optimization of the output voltage of the power supply circuit in the above fourth and fifth embodiment is also applicable to optimizing the operating voltage of each chip 12-18 during normal operation. During normal operation, the operating voltage can be optimized so that the junction temperature does not exceed the upper limit of guaranteed operation, and hence the chips can be illustratively prevented from thermal runaway as well as characteristics degradation and lifetime reduction due to heat.

Furthermore, in SiP, a plurality of heat sources are closely located in one package, and hence thermal design is an important factor. Heat generation from a chip having high power consumption may adversely affect other chips. However, according to an embodiment of the invention, in the case where a chip having high heat generation is mounted with a temperature-sensitive chip having low self-heat generation, the characteristics of the latter chip can be kept optimal by optimizing the supply voltage (operating voltage) to the former chip. An example for realizing this concept is shown in FIG. 9.

Sixth Embodiment

Figure 9:
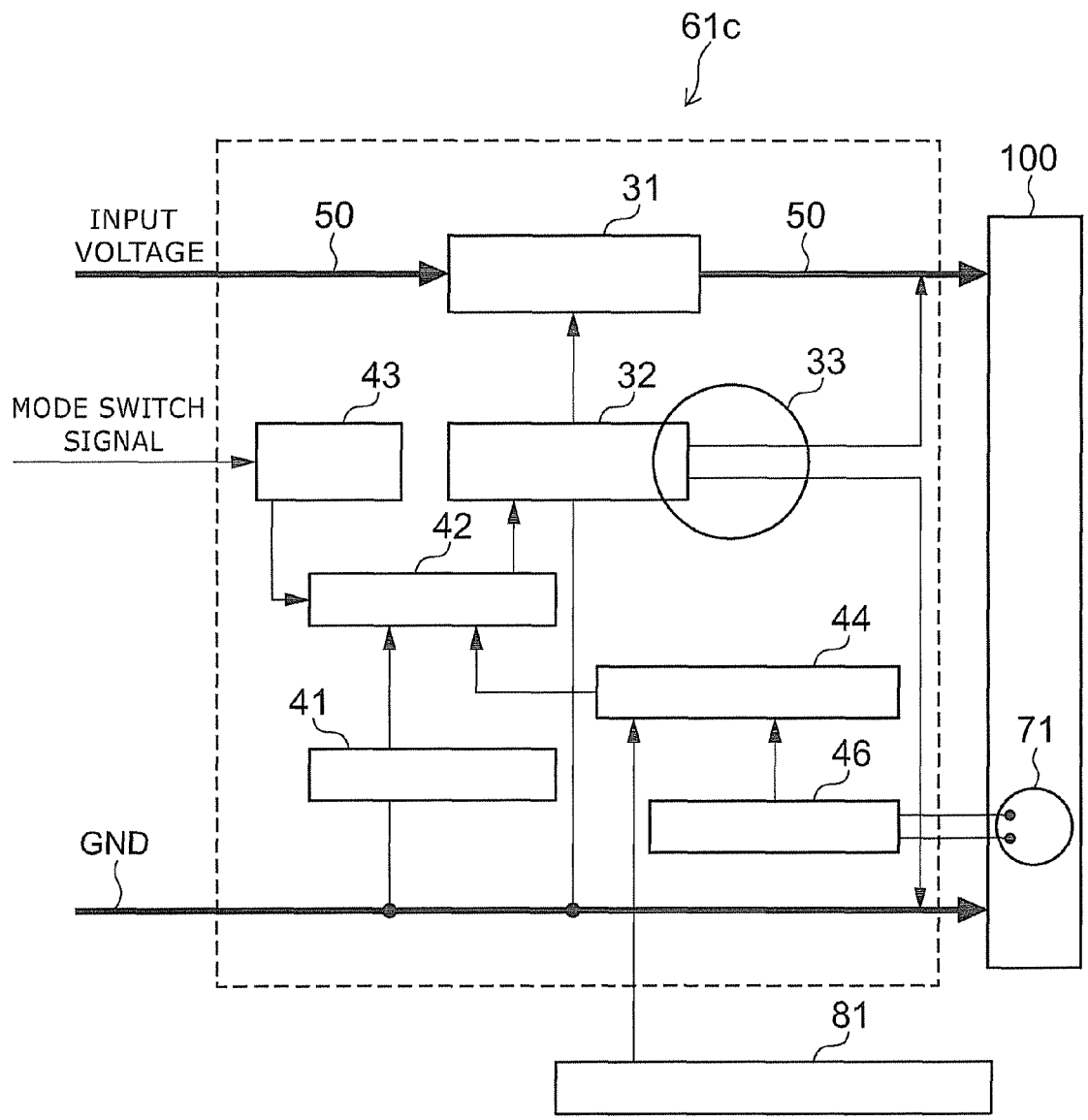
FIG. 9 is a schematic view showing the configuration of a power supply circuit in a semiconductor device according to a sixth embodiment of the invention.

FIG. 9 shows an example of the configuration of a power supply circuit 61c in a semiconductor device according to a sixth embodiment. This power supply circuit 61c corresponds to the power supply circuit 61 described above with reference to FIG. 6.

In this embodiment, in addition to the function of the above fifth embodiment, the optimal voltage setting circuit 44 receives the output (measured temperature or calculated junction temperature) of a temperature monitoring circuit 81 of a chip which is different from the chip 100 to be controlled by the circuit shown in FIG. 9. On the basis thereof, the optimal voltage setting circuit 44 can set an optimal voltage.

For example, the logic chip 13 has high power consumption and heat generation. The analog chip 12 itself has low heat generation, but has large characteristics variation due to temperature. In this case, on the basis of the temperature monitoring result of the analog chip 12, the operating voltage supplied to the logic chip 13 can be optimized to reduce the heat generation of the logic chip 13.

Furthermore, in the case where a DRAM chip is mounted, in order to prevent the temperature-induced effect such as the reduction of the refresh cycle of the DRAM chip, the operating voltage supplied to the logic chip 13 can be optimized to reduce the heat generation of the logic chip 13.

It is noted that a nonvolatile memory can be mounted on the package to save the operating condition (optimal operating voltage for each chip) during the last use so that in the next use, each chip can start operation with the optimal operating voltage.

The embodiments of the invention have been described with reference to examples. However, the invention is not limited thereto, but can be variously modified within the spirit of the invention. The power supply circuit, namely the configuration exemplified by FIGS. 2, 3, 5, 7, 8, 9, is not limited one chip. Example, the power circuit and the voltage control circuit to control the power circuit can be different chip.

The invention claimed is:

1. A semiconductor device comprising, in one package:
   a plurality of semiconductor chips having different operating voltages; and
   a power supply circuit configured to receive an input voltage from an external power supply and supply operating voltages to the semiconductor chips,
   the power supply circuit being capable of switching and supplying a plurality of different voltages for each one of the semiconductor chips,
   the power supply circuit including a communication circuit configured to communicate with an external burn-in mode setting device, and a reference voltage variation circuit configured to receive a burn-in voltage setting signal for each of the semiconductor chips through the communication circuit, the burn-in voltage setting signal being sent from the burn-in mode setting device.

2. The semiconductor device according to claim 1, wherein the power supply circuit switches the voltages supplied to the semiconductor chips in response to an externally provided switch signal.

3. The semiconductor device according to claim 1, wherein the power supply circuit switches the voltages supplied to the semiconductor chips on basis of the input voltage from the external power supply.

4. The semiconductor device according to claim 1, wherein the power supply circuit sets the voltages supplied to the semiconductor chips in response to an externally provided voltage setting signal.

5. The semiconductor device according to claim 1, wherein the power supply circuit has a function of detecting an operating state of the semiconductor chips and optimizes the voltages supplied to the semiconductor chips on basis of the detection result.

6. The semiconductor device according to claim 1, wherein the power supply circuit has a normal operation mode for supplying an operating voltage to each of the semiconductor chips and a burn-in mode for supplying a stress voltage which is higher than the voltage in the normal operation mode.

7. The semiconductor device according to claim 1, wherein the power supply circuit includes a power circuit configured to receive the input voltage from the external power supply, convert the input voltage, and supply the converted voltage to each of the semiconductor chips.

8. The semiconductor device according to claim 7, wherein the power supply circuit includes a voltage measurement section configured to measure an output voltage of the power circuit.

9. The semiconductor device according to claim 8, wherein the power supply circuit includes a voltage control circuit configured to control the power circuit on basis of the voltage measured by the voltage measurement section.

10. The semiconductor device according to claim 9, wherein the power supply circuit includes a switch circuit configured to switch a reference voltage outputted to the voltage control circuit on basis of a mode switch signal provided from an external burn-in mode setting device.

11. The semiconductor device according to claim 9, wherein the power supply circuit includes a switch circuit configured to monitor the input voltage from the external power supply and, in response to the input voltage reaching a prescribed value or more, switch a reference voltage outputted to the voltage control circuit from a first reference voltage corresponding to the operating voltage during normal operation to a second reference voltage corresponding to the stress voltage during burn-in.

12. The semiconductor device according to claim 1, wherein the power supply circuit includes:
   a power circuit configured to receive the input voltage from the external power supply, convert the input voltage, and supply the converted voltage to each of the semiconductor chips;
   a voltage measurement section configured to measure an output voltage of the power circuit; and
   a voltage control circuit configured to control the power circuit so that the voltage measured by the voltage measurement section is equal to a voltage outputted from the reference voltage variation circuit.

13. The semiconductor device according to claim 1, wherein the power supply circuit communicates with an external burn-in mode setting device through a logic chip of the plurality of the semiconductor chips.

14. The semiconductor device according to claim 1, wherein the power supply circuit includes:
   a power circuit configured to receive the input voltage from the external power supply, convert the input voltage, and supply the converted voltage to each of the semiconductor chips;
   a current measurement circuit configured to measure current consumption of the semiconductor chip on basis of a current outputted from the power circuit to the semiconductor chip;
   an optimal voltage setting circuit configured to calculate power consumption of the semiconductor chip in response to the measurement result of the current measurement circuit and set an optimal voltage for the semiconductor chip on basis of the power consumption.

15. The semiconductor device according to claim 14, wherein the optimal voltage setting circuit sets the optimal voltage for the semiconductor chip in a range that the temperature does not exceed a maximum junction temperature defined for each of the semiconductor chips, the maximum junction temperature being obtained from correlation with the power consumption.

16. The semiconductor device according to claim 1, wherein the power supply circuit includes:
   a power circuit configured to receive the input voltage from the external power supply, convert the input voltage, and supply the converted voltage to each of the semiconductor chips;
   a temperature monitoring circuit configured to calculate a maximum junction temperature defined for each of the semiconductor chips from the temperature obtained through a temperature probe provided in the semiconductor chip or on a substrate where the semiconductor chips and the power supply circuit are mounted; and
   an optimal voltage setting circuit configured to set an optimal voltage for the semiconductor chip in a range that the temperature does not exceed the maximum junction temperature.

17. The semiconductor device according to claim 16, wherein the optimal voltage setting circuit sets the optimal voltage for the semiconductor chip to be controlled on basis of an output of the temperature monitoring circuit that monitors the temperature of the semiconductor chip which is different from the semiconductor chip to be controlled.

18. The semiconductor device according to claim 1, wherein the semiconductor chips and the power supply circuit are mounted on the same substrate, and the semiconductor chips and the power supply circuit are connectable to an external circuit through an external terminal extracted to the outside of the substrate.

* * * * *